United States Patent [19]

Leussler

[11] Patent Number: 5,245,288
[45] Date of Patent: Sep. 14, 1993

[54] MAGNETIC RESONANCE EXAMINATION APPARATUS WITH WIRELESS TRANSMISSION OF SPIN RESONANCE SIGNALS FROM HIGH FREQUENCY COIL SYSTEM PROCESSING UNIT

[75] Inventor: Christoph G. Leussler, Hamburg, Fed. Rep. of Germany

[73] Assignee: U.S. Philips Corporation, New York, N.Y.

[21] Appl. No.: 927,585

[22] Filed: Aug. 10, 1992

[30] Foreign Application Priority Data

Aug. 10, 1991 [DE] Fed. Rep. of Germany ....... 4126537

[51] Int. Cl.$^5$ ............................................. G01V 3/00
[52] U.S. Cl. .................................... 324/322; 324/318
[58] Field of Search ............... 324/322, 318, 300, 307, 324/309, 314, 313

[56] References Cited

U.S. PATENT DOCUMENTS

| | | | |
|---|---|---|---|
| 4,739,266 | 4/1988 | Kunz | 324/309 |
| 4,763,075 | 8/1988 | Weigert | 324/322 |

FOREIGN PATENT DOCUMENTS

| | | |
|---|---|---|
| 0368401 | 5/1990 | European Pat. Off. |
| 61-155846 | 7/1986 | Japan . |
| 1-223943 | 9/1989 | Japan . |

OTHER PUBLICATIONS

"Society of Magnetic Resonance in Medicine", Seventh Annual Meeting and Exhibition Bd, 2, Aug. 20, 1988, San Francisco, Calif.
Japanese Abstract of JP-A-1223943.

*Primary Examiner*—Louis Arana

[57] ABSTRACT

A magnetic resonance examination apparatus includes a coil system (10) for receiving spin resonance signals generated in an examination zone, and a processing unit remote from the examination zone for processing the signals received in the coil system. Disturbing effects are liable to occur when a coil system is connected to the processing unit via a cable. These disturbing effects are avoided in that in the direct vicinity of the coil system there is arranged a transmitter for transmitting the spin resonance signals. This transmitter cooperates in a wireless fashion with a receiver to which the processing unit is connected.

20 Claims, 2 Drawing Sheets

MAGNETIC RESONANCE EXAMINATION APPARATUS WITH WIRELESS TRANSMISSION OF SPIN RESONANCE SIGNALS FROM HIGH FREQUENCY COIL SYSTEM PROCESSING UNIT

BACKGROUND OF THE INVENTION

1. Field of the Invention

This invention relates to a high frequency magnetic resonance examination apparatus comprising a coil system for receiving spin resonance signals, generated in an examination zone, and a processing unit for processing the signals received by a high frequency receiving coil system.

2. Description of the Related Art

Apparatus of this kind are known, for example, from EP-OS 226 247, which corresponds to commonly-owned U.S. Pat. No. 4,739,266, granted Apr. 19, 1988. In apparatus of this kind an RF coil system is arranged on the body of a patient during an examination, whereas the processing unit, which may include a reconstruction unit for reconstructing the nuclear magnetization distribution in the examination zone as well as a viewing apparatus for display of the distribution, is arranged at a distance of a few meters therefrom. In the known apparatus of this kind the high frequency coil system is connected to the processing unit via a cable over which received spin resonance signals are conveyed. The cable losses are liable to degrade the signal-to-noise ratio. Moreover, the inevitable lack of symmetry may cause standing waves which detune the coil system and which cause additional high-frequency losses in the tissue of the patient.

SUMMARY OF THE INVENTION

It is an object of the present invention to construct a magnetic resonance examination apparatus of the kind set forth so that the described defects cannot occur. This object is achieved, in accordance with the invention, in that in the direct vicinity of the coil system there is arranged a transmitter for the transmission of the magnetic resonance signals which cooperates in a wireless fashion with a receiver to which the processing unit is connected.

In accordance with the invention, the magnetic resonance signal is transmitted in a wireless fashion from the high frequency coil system to the remote processing unit. As a result, the effects associated with the use of a cable connection are eliminated.

Such a wireless transmission can in principle be realised by means of an infra-red or ultrasound transmission channel. In a preferred embodiment of the invention, however, the transmitter and the receiver comprise a respective antenna and the transmitter also comprises a frequency converter. The frequency converter ensures that the electromagnetic waves emitted by the antenna included in the transmitter cannot be received by the coil system which is tuned to the Larmor frequency prevailing in the examination zone.

In a further embodiment of the invention, the frequency converter comprises a mixing stage in which the spin resonance signal is mixed with a mixing signal of constant frequency.

The requirements imposed as regards the constancy of frequency and phase of the auxiliary signal are as high as the requirements to be imposed on an oscillator generating signals of Larmor frequency in the processing unit.

Such an oscillator would be comparatively expensive and bulky and would, because the frequency stabilization can usually be achieved only by temperature control of the oscillator, represent a substantial load on the supply voltage source for powering the transmitter arranged near the examination coil, said source preferably being a (preferably rechargeable) battery.

Therefore, in a further embodiment of the invention a receiver for receiving the wireless transmitted auxiliary signal is arranged in the direct vicinity of the coil system, the mixing signal being derived from said auxiliary signal so as to be mixed with the spin resonance signal in the mixer. The necessary surface area and the energy consumption can remain small, notably when use is made of comparatively high frequencies and components manufactured according to the integrated circuit technique.

The mixing signal is effectively derived from the auxiliary signal by generating the mixing signal by means of an oscillator which is synchronized by the auxiliary signal. The oscillator, being arranged in the direct vicinity of the coil system, need not satisfy severe requirements as regards frequency and phase stability because it is synchronized by the auxiliary signal.

In a further embodiment of the invention, the frequency of the high-frequency generator and of the auxiliary signal are derived from a common reference signal source. Because the frequency of the auxiliary signal as well as the Larmor frequency at which the high-frequency transmitter coil operates are derived from a common reference oscillator, only limited technical means will be required and both frequencies will be rigidly coupled to one another.

In practice it is not possible to power the transmitter arranged near the coil system with a supply voltage derived from a main supply because such a main supply unit would also require a cable for connection to a supply voltage source. When the supply voltage for the transmitter is obtained in a different manner, for example by way of a battery or accumulator device, it is important to minimize the energy consumption. In a further embodiment of the invention this is achieved in that the supply voltage for at least a part of the transmitter is fed via a controllable switch which remains closed for a defined period of time subsequent to a high-frequency pulse in the examination zone. The supply voltage is then switched off a defined period of time after the last high-frequency pulse generated in the examination zone.

BRIEF DESCRIPTION OF THE DRAWING

The invention will be described in detail hereinafter with reference to the accompanying drawing, in which.

DESCRIPTION OF THE PREFERRED EMBODIMENTS

Figure 1:
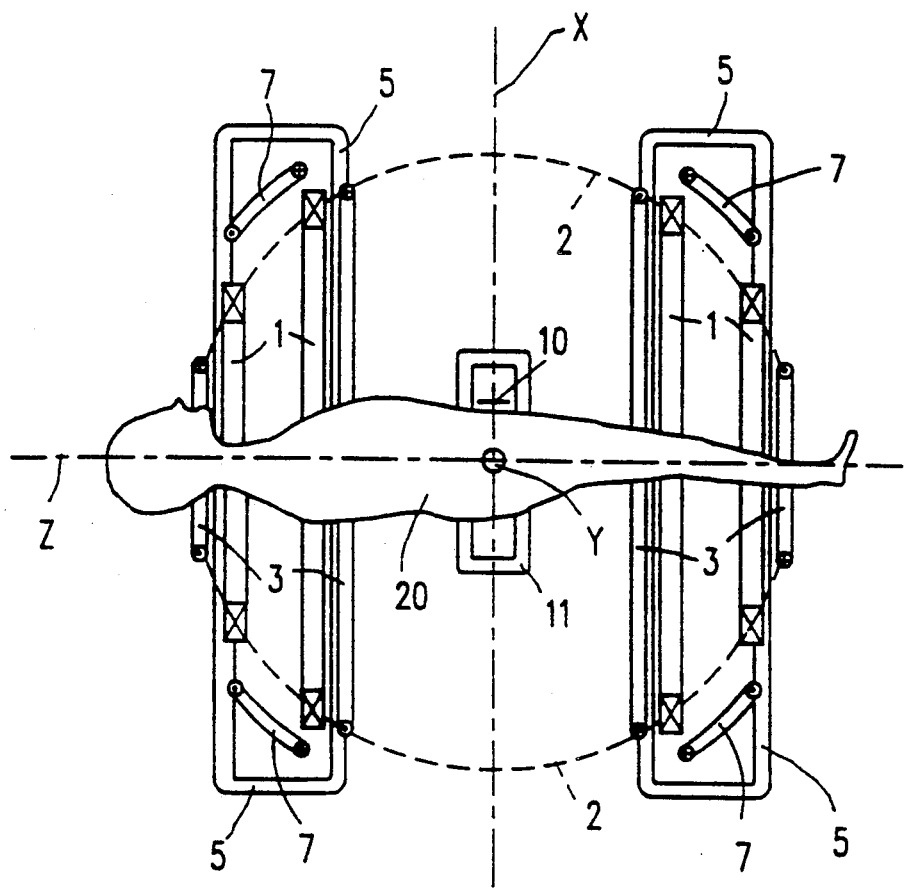
FIG. 1 shows diagrammatically a magnetic resonance examination apparatus in which the invention can be used.

The magnetic resonance examination apparatus shown in FIG. 1 comprises a system consisting of four coils 1 for generating a steady, uniform magnetic field extending in the z-direction. The coils are concentrically situated relative to the z-axis and may be arranged on a spherical surface 2. The patient 20 to be examined is arranged within these coils. There is also provided a high-frequency transmitter coil 11 which is constructed so that it can generate a substantially uniform high-frequency magnetic field extending perpendicular to the z-direction. The frequency of the latter high-frequency magnetic field should correspond to the Larmor frequency $f_o$, for which:

$$f_o = cB.$$

Therein, B is the magnetic induction of the uniform, steady magnetic field and c is the gyromagnetic constant which amounts to approximately 42.58 MHz/T for hydrogen protons. The transmitting coil 11 is permanently mounted in the apparatus and is connected, via a cable (not shown), to a high-frequency generator which generates high-frequency pulses whose amplitude and duration are proportioned so that they rotate the nuclear magnetization out of the z-direction, preferably in a plane extending perpendicular thereto.

The excitation of the nuclear magnetization by the high-frequency pulses induces spin resonance signals in the examination zone influenced by the high-frequency coil, said resonance signals being dependent on the nuclear magnetization distribution. These spin resonance signals are detected by means of a receiving coil system 10, for example a surface coil, which is arranged on a flexible or rigid carrier. The signal induced in this coil system, being tuned to the Larmor frequency $f_o$, is applied to a processing unit which is not shown in FIG. 1 and which determines the spatial or spectral distribution of the nuclear magnetization therefrom.

There are also provided gradient coil systems which each consist of several coils 3, 5 and 7 and which are capable of generating a magnetic field extending in the z-direction with a gradient in the x, the y or the z-direction. During the generation of the high-frequency pulse, these coils conduct a current, upon appearance of the spin resonance signal or therebetween, after which a spatial assignment of the nuclear magnetization distribution can be derived.

Figure 2:
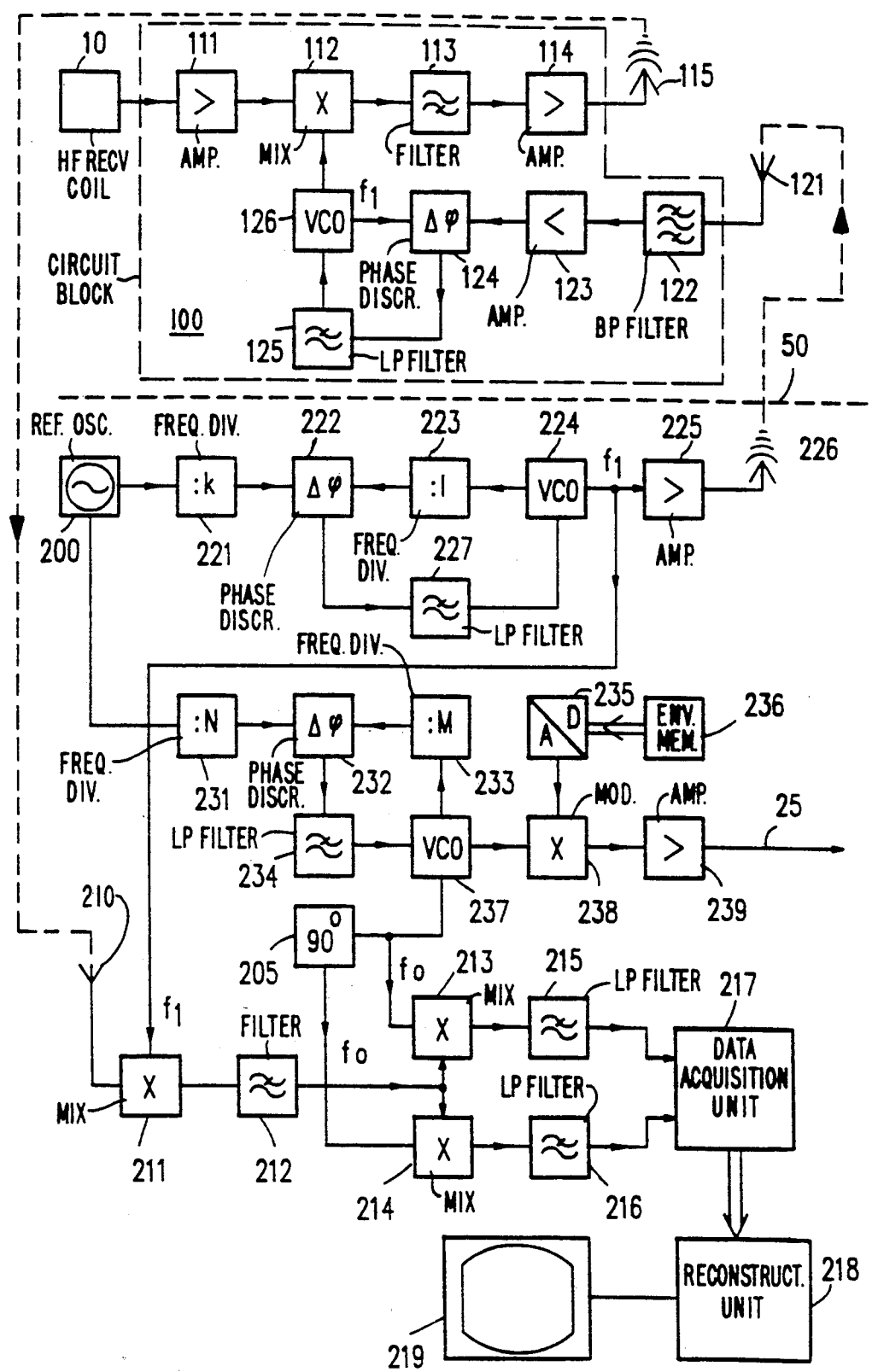
FIG. 2 shows a block diagram of such an apparatus.

As appears from FIG. 2, the spin resonance signal induced in the coil 10 is amplified by a low-noise amplifier 111 and applied, via a frequency converter 112, 113 and a further amplifier 114, to an antenna 115 which transmits the signal as part of a high frequency signal. Because the receiver for this antenna signal is situated at a distance of only a few meters at the area of the processing unit, the transmission power may be comparatively low. The gain of the amplifier 111 must be sufficient to prevent degrading of the signal-to-noise ratio by the frequency conversion and the transmission.

The frequency converter comprises a mixing stage 112 in which the spin resonance signal is mixed with a mixing signal of constant frequency $f_1$. The mixing stage 112, preferably a semiconductor circuit, outputs a signal which is proportional to the product of the signals at the inputs of the mixing stage. The output signal thus contains components having the difference frequency $/f_1 - f_0/$ or the sum frequency $f_1 + f_0$. The filter 113 suppresses the difference frequency component and conducts only the component having the sum frequency. It may be formed by a band-pass filter tuned to the sum frequency or by a suitable high-pass filter.

The frequency $f_1$ of the mixing signal is chosen (from a few MHz to a few 100 MHz) so that the sum frequency $f_1 + f_0$ is sufficiently high to enable wireless transmission via sample antenna means. The frequency $f_1$ is notably chosen so that the sum frequency, or the harmonic thereof, is not coincident with harmonics of the frequencies $f_1$ or $f_0$.

The mixing signal could in principle be supplied by a frequency and phase stabilized oscillator. The latter should be situated in the direct vicinity of the circuit components 111 . . . 114 and should satisfy very severe requirements as regards frequency and phase stability. Oscillators of this kind are still comparatively bulky and expensive at present and also require a comparatively large amount of energy for their temperature stabilization. Therefore, the frequency of the mixing signal is derived from a wireless transmitted auxiliary signal satisfying the requirements imposed as regards frequency and phase stability.

To this end, there is provided an additional antenna 121 (if the antenna 115 were of a sufficiently broadband type, it could also be used). The antenna signal is applied to an amplifier 123 via a band-pass filter 122 tuned to the frequency of the auxiliary signal. If the auxiliary signal had the desired frequency $f_1$ and if it could be received without amplitude fluctuations, it could be applied directly from the amplifier 123 to the mixing stage 112.

In the present case, however, the mixing signal is generated by a frequency-controllable oscillator 126 which is synchronized by the reference signal. To this end, the mixing signal generated by the oscillator is applied not only to the mixing stage 112 but also, if necessary via a frequency divider, to an input of a phase discriminator 124. The second input of the phase discriminator 124 is connected, possibly via a frequency divider, to the output of the amplifier 123. The phase discriminator generates a signal which is dependent on the phase deviation. This signal is applied, via a low-pass filter 125, to the control input of the oscillator 126 whose frequency and phase are varied by the phase control circuit formed by the elements 124 . . . 126 until the signals applied to the inputs of the phase discriminator are identical in respect of frequency and phase.

The components 111 . . . 126 are arranged in the direct vicinity of the coil system 10, for example, on said support on which the coil 10 is mounted. If desired, there may also be provided a connector via which the components 111 . . . 126, mounted on a suitable substrate, can be detachably connected to the coil so that this unit can also be used for other coils.

When so-called array coils are used for the reception of spin resonance signals from different parts of the body, which array coils supply mutually independent spin resonance signals, the latter signals must be converted to different frequencies. With the exception of the components 121 . . . 123, all components should then be provided a corresponding number of times, and the various frequencies for the mixing signals could then be generated by arranging frequency dividers having different frequency division factors between the amplifier 123 and the phase discriminator 124.

As is symbolically indicated by the dashed line 50 in FIG. 2, the unit accommodating the components 10 . . . 126 is situated at a distance of a few meters from the processing unit which is shown below the line 50. It comprises an antenna 210 which receives the signal transmitted by the antenna 115 and applies this signal, possibly via a preamplifier, to one input of a first mixing stage 211. The other input of this mixing stage receives a signal having the frequency $f_1$ so that the output of the mixing stage 211 carries a signal which contains a signal component of the frequency $2f_1+f_0$ and a signal component of the frequency $f_0$. Via a filter 212 which is constructed either as a band-pass filter conducting only the frequency $f_0$ or as a low-pass filter suppressing the component $2f_1+f_0$, the signal component around the Larmor frequency $f_0$ is filtered out and applied to a respective input of two identical mixing stages 213 and 214.

The respective other input of these mixing stages receives a mixing signal of the frequency $f_0$ directly (mixing stage 213) and via a 90° phase shifter 205 (mixing stage 214). The mixing stages 213 and 214 are succeeded by a respective low-pass filter 215 and 216, respectively, which suppresses the component of higher frequency. The components 205 and 213 ... 216 thus constitute a quadrature demodulator whose low-frequency analog output signals contain the information regarding the nuclear magnetization within the examination zone. These signals are applied to a data acquisition unit 217 in which they are converted into digital data words for storage. Via a reconstruction unit 218, the spectral and/or spatial distribution of the nuclear magnetization in the examination zone is determined from the values stored, said distribution being applied to a suitable monitor 219 or the like.

It would in principle be possible to derive the signals of the frequencies $f_1$ and $f_o$ from different oscillators. However, each of the latter should then satisfy the severe requirements as regards frequency and phase stability. A different approach is used in the arrangement shown in FIG. 2 in which the frequencies are derived from a common reference oscillator 200. This oscillator may be constructed so that it exhibits the necessary frequency and phase stability in a predetermined temperature range and a predetermined supply voltage range. Via a frequency divider 221, the reference oscillator is connected to one input of a phase discriminator 222 whose other input is connected to a frequency-controllable oscillator 224, via a frequency divider 223. The frequency $f_r$ of the reference oscillator should satisfy $$f_r = k/l f_1,$$

where k and l are the integer frequency division factors of the frequency dividers 221 and 223, respectively. The output of the phase discriminator is connected, via a low-pass filter 227, to the control input of the oscillator 224 so that the frequency and phase stability of the signal supplied by the oscillator 224 is determined by the reference oscillator 200.

The output signal of the oscillator 224 is applied on the one hand as a mixing signal to an input of the mixing stage 211 and on the other hand to an amplifier 225 which is connected to an antenna 226 which cooperates with the antenna 121 in the transmitter.

The signals generated by the reference oscillator 200 are also used to synchronize an oscillator 237 by means of the frequency dividers 231 and 233, the phase discriminator 232 and the low-pass filter 234, the latter oscillator generating a signal of the frequency $f_o$. In a modulation stage 238, this signal is modulated with an envelope signal corresponding to the envelope of the high-frequency pulse to be generated by the high-frequency transmitter coil, said envelope signal being obtained from an envelope signal memory 236 which is coupled, via a digital-to-analog converter 235, to a modulation input of the modulation stage 238. The signal modulated on the carrier frequency $f_o$ is amplified by an amplifier 239 and applied to the high-frequency transmitting coil 11 via a fixed cable 25.

The frequency-controllable oscillators 126, 224 and 237 are preferably quartz oscillators. The frequency of a quartz oscillator can be controlled, for example, by means of a capacitance diode which is connected in the same way relative to the quartz as the so-called "pulling" capacitors, i.e. for example in series with the oscillator quartz. Such an oscillator has only a comparatively small tuning range, but already offers a given frequency and phase stability.

The supply voltage for the components 111 ... 126 of FIG. 2 can be derived from one or more batteries which may also be of a rechargeable type (accumulators). This is because a comparatively bulky mains power supply in the vicinity of these components could cause interference signals. However, in the case of a supply voltage from a battery it is essential that the energy consumption of the circuit powered thereby is low.

Figure 3:
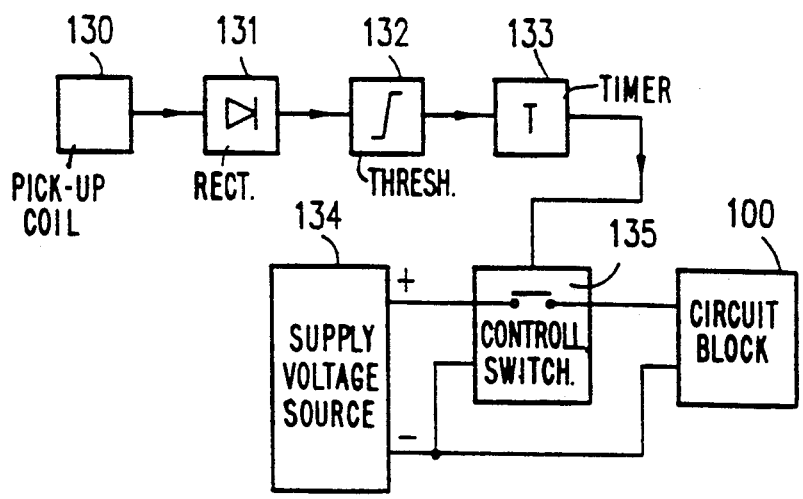
FIG. 3 shows the block diagram of a unit for switching the supply voltage for the transmitter on and off.

In accordance with FIG. 3, such a low energy consumption is achieved in that the supply voltage for the components 111 ... 126, contained in the circuit block 100 in FIG. 3 is applied via a controllable switch 135 connected to the supply voltage source 134. This switch is closed by a timer 133 whenever high-frequency pulses are generated in the examination zone by the coil 11. These pulses can be detected by means of a pick-up coil 130 which is magnetically coupled to the high-frequency coil 11. The coupling should be so loose that excessive extraction of energy from the high-frequency field generated by the coil 11 is avoided and that the high-frequency field remains undistorted. The pick-up coil 130 is followed by a rectifier 131 whose output signal controls a comparator 32 which switches the timer 133. After each high-frequency pulse, the output voltage of the rectifier 131 exceeds a threshold voltage in the comparator 132, thus activating the timer 133. The timer remains in the activated condition for a period of time which is greater than the time period between two high-frequency pulses during a magnetic resonance examination. The duration of activation may amount to seconds or even minutes. When the period of time imposed by the timer 133 elapses after a high-frequency pulse without a new high-frequency pulse appearing, the timer 133 opens the switch 135. The components 131 ... 135 remain permanently connected to the supply voltage.

When the energy consumption of the components 111 ... 126 is sufficiently low, the power supply voltage can also be derived directly from the high-frequency pulses. Because the high-frequency pulses for the coil 11 have a power of from a few 100 W to one kW, an energy of some tenths of a W or less can be derived from the high-frequency magnetic field without giving rise to disturbances.

I claim:

1. A magnetic resonance examination apparatus, comprising a receiving coil system for receiving spin resonance signals generated in an examination zone, and a processing unit remote from the examination zone for processing the signals received by the receiving coil system, characterized in that in the direct vicinity of the receiving coil system there is arranged a transmitter connected to the receiving coil system for transmitting high frequency signals derived from the spin resonance signals received by said receiving coil system, in a wireless fashion, to a receiver connected to the processing unit.

2. A magnetic resonance examination apparatus as claimed in claim 1, wherein the transmitter and the receiver each comprise a respective antenna and the transmitter also comprises a frequency converter for deriving the high frequency signal for wireless transmission by the transmitter to the receiver.

3. A magnetic resonance examination apparatus as claimed in claim 2, wherein the frequency converter comprises a mixing stage in which the spin resonance signal is mixed with a mixing signal of constant frequency ($f_1$).

4. A magnetic resonance examination apparatus as claimed in claim 3, wherein in the direct vicinity of the receiving coil system there is arranged a receiver for receiving a wireless transmitted auxiliary signal from a further transmitter in the vicinity of the processing unit, and means for deriving said mixing signal from said auxiliary signal.

5. A magnetic resonance examination apparatus as claimed in claim 4, wherein the deriving means comprises, a variable frequency oscillator, and means for synchronizing said variable frequency oscillator to the auxiliary signal.

6. A magnetic resonance examination apparatus as claimed in claim 4, comprising a high-frequency generator which acts on a transmitting coil system for generating a high-frequency magnetic field in the examination zone, wherein the high-frequency generator (f) and a generator of the auxiliary signal ($f_1$) receive a common reference oscillatory signal from a reference source.

7. A magnetic resonance examination apparatus as claimed in claim 1, comprising a high-frequency generator which acts on a transmitter coil system for generating a high-frequency magnetic field in the examination zone, wherein a supply voltage for at least a part of the transmitter is fed via a controllable switch which remains closed for a defined period of time subsequent to a high-frequency pulse in the examination zone.

8. A magnetic resonance examination apparatus as claimed in claim 1, comprising, a high-frequency generator which supplies high-frequency pulses to a transmitter coil system for generating a high-frequency magnetic field in the examination zone, and wherein a supply voltage for at least a part of the transmitter is derived from the high-frequency pulses.

9. A magnetic resonance examination apparatus comprising:
   a transmitter coil system for producing a high-frequency magnetic field in an examination zone of the magnetic resonance examination apparatus,
   a receiving coil system for receiving spin resonance signals generated in the examination zone of the apparatus,
   a transmitter arranged in close vicinity to the receiving coil system and connected thereto for the wireless transmission to a receiver of high frequency signals derived from the spin resonance signals received by said receiving coil system,
   said receiver being remote from the examination zone,
   wherein the frequency of said high frequency signals is chosen to be significantly different from the frequency of the spin resonance signals or harmonics thereof, and
   a processing unit also remote from the examination zone and coupled to the receiver for processing the high frequency signals received by the receiver thereby to derive from said signals the spin resonance signals.

10. A magnetic resonance examination apparatus as claimed in claim 9 wherein the transmitter comprises;
    means for deriving a constant frequency mixing signal, and
    a frequency converter responsive to the mixing signal and to the spin resonance signal from the receiving coil system for deriving said high frequency signals.

11. A magnetic resonance examination apparatus as claimed in claim 10 further comprising, in the vicinity of the processing unit, a further transmitter including means for generating an auxiliary signal and means for the wireless transmission of the auxiliary signal, and
    in the vicinity of the receiving coil system, a further receiver for receiving the wireless transmitted auxiliary signal from the further transmitter, said further receiver comprising means for deriving said mixing signal from said auxiliary signal.

12. A magnetic resonance examination apparatus as claimed in claim 11 wherein the deriving means comprises, a variable frequency oscillator, and means for synchronizing said variable frequency oscillator to the auxiliary signal.

13. A magnetic resonance examination apparatus as claimed in claim 12 wherein the synchronizing means further comprise a phase discriminator having a first input coupled to an output of the variable frequency oscillator, a second input for receiving said auxiliary signal via a first filter, and an output coupled to an input of the variable frequency oscillator via a second filter.

14. A magnetic resonance examination apparatus as claimed in claim 10 further comprising;
    a high frequency generator for supplying a high frequency signal to said transmitter coil system,
    in the vicinity of the processing unit, a further transmitter including means for generating an auxiliary signal and means for the wireless transmission of the auxiliary signal to a further receiver in the vicinity of the transmitter,
    said further receiver including means responsive to the auxiliary signal for deriving said mixing signal, and
    in the vicinity of the processing unit, a reference oscillator for supplying a common reference AC signal to said high frequency generator and to said auxiliary signal generating means whereby the frequencies thereof are controlled by the reference oscillator.

15. A magnetic resonance examination apparatus as claimed in claim 10 wherein the processing unit comprises means for transmitting a wireless auxiliary signal of a frequency ($f_1$) to a second receiver in the vicinity of the transmitter, and wherein
    the second receiver comprises means for deriving said mixing signal from said auxiliary signal, said mixing signal having a frequency ($f_1$) and the spin resonance signal having a frequency ($f_0$), said high frequency signals having a frequency ($f_1+f_0$), and the frequency ($f_1$) of said mixing signal being chosen so that the frequency ($f_1+f_0$) of the high frequency signals is significantly different from harmonics of the mixing signal frequency ($f_1$) and the spin resonance signal ($f_0$).

16. A magnetic resonance examination apparatus as claimed in claim 10 wherein the mixing signal deriving means includes a variable frequency oscillator which produces a mixing signal of a frequency ($f_1$), said spin resonance signal having a frequency ($f_0$), and said high frequency signals having a frequency ($f_1+f_0$), and wherein the frequency ($f_1$) of said mixing signal is chosen so that the frequency ($f_1+f_0$) of the high frequency signals is significantly different from harmonics of the mixing signal frequency ($f_1$) and the spin resonance signal ($f_0$).

17. A magnetic resonance examination apparatus as claimed in claim 9 further comprising;
a high-frequency generator for supplying a high-frequency signal to said transmitter coil system,
a controllable switch for coupling a source of supply voltage to at least a part of the transmitter, and
means controlled by a high-frequency electric pulse produced in the examination zone by the transmitter coil system for triggering the controllable switch closed for a given period of time.

18. A magnetic resonance examination apparatus as claimed in claim 17 wherein said triggering means comprises a pick-up coil magnetically coupled to the transmitter coil system and electrically coupled in cascade with a threshold circuit and a timer circuit.

19. A magnetic resonance examination apparatus as claimed in claim 10 wherein the processing unit comprises;
a further transmitter including means for generating an auxiliary signal and means for the wireless transmission of the auxiliary signal,
a reference oscillator for supplying a reference AC signal to said auxiliary signal generating means whereby the frequency thereof is controlled by the reference oscillator, wherein
said receiver includes a mixer circuit controlled by the received wireless transmitter high-frequency signals and by the auxiliary signal derived in the further transmitter,
a variable frequency oscillator controlled by said reference oscillator to produce a signal of the spin resonance frequency,
means coupled to an output of the mixer circuit for deriving the spin resonance signal,
a data acquisition unit controlled at least in part by the signal supplied by the variable frequency oscillator and the signal deriving means, and
in the vicinity of the receiving coil system, a further receiver for receiving the wireless transmitted auxiliary signal from the further transmitter, said further receiver comprising means for deriving said mixing signal from said auxiliary signal.

20. A magnetic resonance examination apparatus as claimed in claim 19 further comprising;
a high frequency generator for supplying a high frequency signal to said transmitter coil system, said high frequency generator including a second variable frequency oscillator controlled by said reference oscillator.

* * * * *